United States Patent
Heo et al.

(10) Patent No.: US 9,911,605 B2
(45) Date of Patent: Mar. 6, 2018

(54) METHODS OF FORMING FINE PATTERNS

(71) Applicant: SK hynix Inc., Gyeonggi-do (KR)

(72) Inventors: Jung Gun Heo, Daejeon (KR); Hong Ik Kim, Gyeonggi-do (KR); Keun Do Ban, Gyeonggi-do (KR); Cheol Kyu Bok, Seoul (KR); Young Sik Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 15/236,680

(22) Filed: Aug. 15, 2016

(65) Prior Publication Data

US 2017/0271149 A1    Sep. 21, 2017

(30) Foreign Application Priority Data

Mar. 21, 2016  (KR) .......................... 10-2016-0033473

(51) Int. Cl.
*H01L 21/4763* (2006.01)
*H01L 21/027* (2006.01)
*H01L 21/3105* (2006.01)
*H01L 27/108* (2006.01)

(52) U.S. Cl.
CPC .... *H01L 21/0274* (2013.01); *H01L 21/31058* (2013.01); *H01L 27/10844* (2013.01)

(58) Field of Classification Search
None
See application file for complete search history.

(56) References Cited

U.S. PATENT DOCUMENTS

| 8,357,606 | B2 * | 1/2013 | Chen | .................. H01L 21/0337 257/E21.668 |
| 2007/0099431 | A1 * | 5/2007 | Li | ....................... H01L 21/3081 438/735 |
| 2012/0153175 | A1 * | 6/2012 | Tredwell | ........... H01L 27/14663 250/370.08 |
| 2015/0024597 | A1 * | 1/2015 | Gao | .................... H01L 21/3086 438/694 |

FOREIGN PATENT DOCUMENTS

KR    1020120059024    6/2012

* cited by examiner

*Primary Examiner* — Calvin Choi
(74) *Attorney, Agent, or Firm* — IP & T GROUP LLP

(57) ABSTRACT

A method of forming fine patterns includes forming pillars arrayed in rows and columns on an underlying layer and forming a spacer layer on the underlying layer to cover the pillars. Portions of the spacer layer respectively covering the pillars arrayed in each row or in each column are in contact with each other to provide first interstitial spaces disposed between the pillars arrayed in a diagonal direction between a row direction and a column direction as well as to provide cleavages at corners of each of the first interstitial spaces in a plan view. A healing layer is formed on the spacer layer to fill the cleavages of the first interstitial spaces. The healing layer is formed to provide second interstitial spaces respectively located in the first interstitial spaces as well as to include a polymer material.

8 Claims, 22 Drawing Sheets

METHODS OF FORMING FINE PATTERNS

CROSS-REFERENCE TO RELATED APPLICATIONS

The present application claims priority under 35 U.S.C 119(a) to Korean Patent Application No. 10-2016-0033473, filed on Mar. 21, 2016, which is incorporated herein by reference in its entirety.

BACKGROUND

1. Technical Field

Various embodiments of the present disclosure relate generally to semiconductor technologies and, more particularly, to methods of forming fine patterns.

2. Related Art

With the rapid growth of the semiconductor industry, a lot of effort has been focused on integrating more patterns in a limited area of a semiconductor substrate. That is, attempts to increase the integration density of semiconductor devices have typically focused in forming finer patterns. Various techniques have been proposed for forming fine patterns having a nano-scale critical dimension (CD), for example, from a size of about a few nanometers to about several tens of nanometers.

In the event that the fine patterns of the semiconductor devices are formed using only a photolithography process, there may be some limitations in forming the fine patterns due to image resolution limits of photolithography apparatuses used in the photolithography process. The image resolution limits of photolithography apparatuses may be due to the wavelengths of lights generated from light sources used in the photolithography apparatuses and to the resolution limit of existing optical systems used in the photolithography apparatuses. Recently, a double patterning technology (DPT) or a spacer patterning technology (SPT) has been proposed to overcome the resolution limits of the lithography apparatuses and to realize even more fine patterns.

SUMMARY

According to an embodiment, there is provided a method of forming fine patterns. The method includes forming pillars arrayed in rows and columns over an underlying layer and forming a spacer layer over the underlying layer to cover the pillars. Portions of the spacer layer respectively covering the pillars arrayed in each row or in each column are in contact with each other to provide first interstitial spaces disposed between the pillars arrayed in a diagonal direction between a row direction and a column direction and to provide cleavages at corners of each of the first interstitial spaces in a plan view. A healing layer is formed on the spacer layer to fill the cleavages of the first interstitial spaces. The healing layer is formed to provide second interstitial spaces respectively located in the first interstitial spaces and to include a polymer material.

According to another embodiment, there is provided method of forming fine patterns. The method includes forming pillars arrayed in rows and columns over an underlying layer and forming a spacer layer over the underlying layer to cover the pillars. The spacer layer is formed to provide first interstitial spaces disposed between the pillars arrayed in a diagonal direction between a row direction and a column direction. A healing layer is formed on sidewalls of the spacer layer to smooth a surface profile of the sidewalls of the spacer layer in a plan view. The healing layer is formed to include a polymer material.

According to yet another embodiment, there is provided a method of forming fine patterns. The method includes forming pattern structures over an underlying layer. The pattern structures are formed to provide first interstitial spaces therebetween and to include sidewalls having cleavages. A healing layer is formed over the sidewalls of the pattern structures to fill the cleavages and to provide second interstitial spaces respectively located in the first interstitial spaces. The healing layer is formed to include a polymer material.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
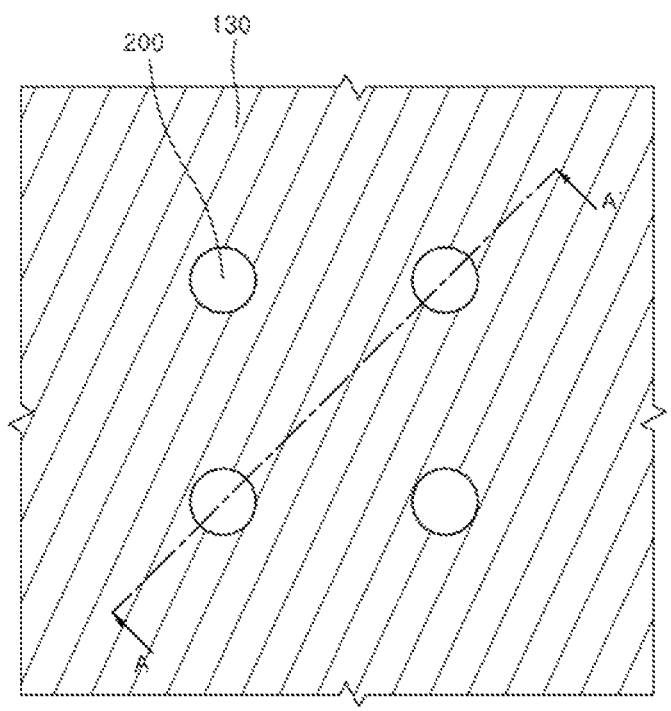
FIGS. 1 to 16 illustrate a method for forming fine patterns according to an embodiment of the present disclosure.

Example embodiments will be described in more detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present disclosure to those skilled in the art.

The drawings are not necessarily to scale and, in some instances, proportions may have been exaggerated to more clearly illustrate the various elements of the embodiments. For example, in the drawings, the size of elements and the intervals between elements may be exaggerated compared to actual sizes and intervals for convenience of illustration.

The terminology used herein is for the purpose of describing particular embodiments only and is not intended to be limiting of the present disclosure. If defined in detail, the terms may be construed according to the definitions. Unless otherwise defined, the terms used herein have the same meaning as commonly understood by one of ordinary skill in the art to which the embodiments belong in view of the present disclosure.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element or layer is referred to as being "on" "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent"). In the following description, numerous specific details are set forth to provide a thorough understanding of the present disclosure. The present disclosure may be practiced without some or all of these specific details. In other instances, well-known process structures and/or processes have not been described in detail in order not to unnecessarily obscure the present disclosure.

It is also noted, that in some instances, as would be apparent to those skilled in the relevant art, a feature or element described in connection with one embodiment may be used singly or in combination with other features or elements of another embodiment, unless otherwise specifically indicated.

The following embodiments may be applied to realization of integrated circuits, such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices employing integrated logic circuits.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
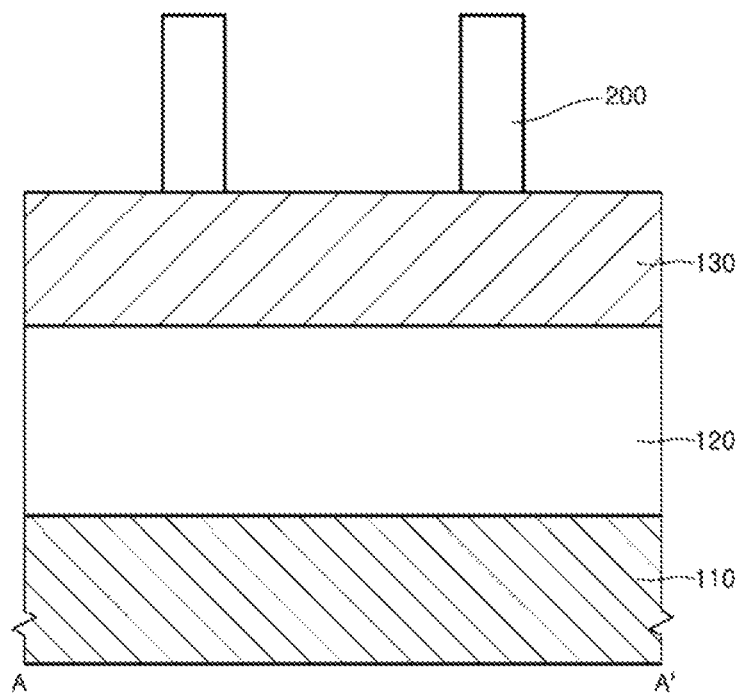

FIGS. 1 and 2 illustrate a forming of an array of pillars 200. FIG. 2 is a cross-sectional view taken along a line A-A' of a plan view of FIG. 1.

As illustrated in FIGS. 1 and 2, the array of the pillars 200 may be formed on an underlying layer 130. Each of the pillars 200 may have a partition pattern, and spacers may be formed on sidewalls of the pillars 200 in a subsequent process. The pillars 200 having partition pattern shapes may be formed using a photolithography process. In some embodiments, line/space patterns instead of the pillars 200 may be formed. The line/space patterns may include a plurality of line patterns which are repeatedly arrayed in one direction to provide spaces therebetween, and the plurality of line patterns may extend in another direction substantially perpendicular to the one direction. Alternatively, a pattern providing a plurality of holes may be formed instead of forming the pillars 200. A plurality of hole-shaped patterns uniformly and repeatedly arrayed may be required to form an isolation structure or a plurality of bit line contacts of DRAM devices or to form electrodes of resistance change memory devices, such as phase change memory (PCM) devices. In such a case, the pillars 200 may be used as primary patterns corresponding to preliminary patterns for forming some of the plurality of hole-shaped patterns.

Each of the pillars 200 may have a circular shape in a plan view. In some embodiments, each of the pillars 200 may have an oval shape which is laterally elongated. As illustrated in FIG. 1, the pillars 200 may be arrayed so that four adjacent pillars 200 are located at four vertices of a tetragon, respectively. The tetragon may be a square as in FIG. 1, or may be some other tetragon. For example, in another embodiment, it may be a rectangle. In some embodiments, the pillars 200 may be arrayed so that six adjacent pillars 200 are located at six vertices of a hexagon, respectively. In some other embodiments, the pillars 200 may be arrayed so that three adjacent pillars 200 are located at three vertices of a triangle, respectively. The pillars 200 may extend substantially perpendicular to a surface of the underlying layer 130.

The underlying layer 130 may be formed on a substrate 110 and may be formed of a different material from the pillars 200. If the pillars 200 are formed to include a first material, the underlying layer 130 may include a second material, which is different from the first material. A patterning target layer 120 may be formed between the underlying layer 130 and the substrate 110. The patterning target layer 120 may correspond to a layer, which is finally patterned. The substrate 110 may include a semiconductor layer on which electronic circuits are integrated. The substrate 110 may be a silicon substrate or a silicon wafer.

The underlying layer 130 may be a layer that can be patterned using a hard mask or an etch mask. The patterning target layer 120 may be an interlayer dielectric (ILD) layer or an inter-metal dielectric (IMD) layer. The patterning target layer 120 may be a conductive layer, such as a metal layer for forming interconnections. The patterning target layer 120 may be a template layer or a mold layer for a damascene process. The patterning target layer 120 or the underlying layer 130 may have a multi-layered structure including a plurality of different materials. The patterning target layer 120 may be a semiconductor substrate or a semiconductor layer. The patterning target layer 120 may be formed of a dielectric layer including silicon oxide layer, such as, tetra-ethyl-ortho-silicate (TEOS) layer having a thickness of about 2200 angstroms. The underlying layer 130 may include an amorphous spin-on-carbon (SOC) layer having a thickness of about 730 angstroms to about 1000 angstroms. The underlying layer 130 may further include a silicon oxynitride (SiON) layer stacked on the SOC layer. In such a case, the SiON layer may have a thickness of about 300 angstroms to about 350 angstroms.

A pillar layer for forming the pillars 200 may be formed on the underlying layer 130. In an embodiment the pillar layer may be formed of an amorphous carbon layer such as a SOC layer having a thickness of about 700 angstroms to about 800 angstroms. The pillar layer may further include a silicon oxynitride (SiON) layer stacked on the amorphous carbon layer.

The pillar layer may be patterned using a photolithography process to form the array of the pillars 200. Specifically, a photoresist layer (not shown) may be formed on the pillar layer, portions of the photoresist layer may be selectively exposed to a light using a photomask (not shown), and the exposed photoresist layer may be developed to form a photoresist pattern (not shown). Before the photoresist layer is formed, an anti-reflective coating (ARC) layer may be additionally formed on the pillar layer to suppress an irregular reflection phenomenon during the exposure step so that portions of the photoresist layer are selectively exposed to a light. The photoresist pattern may be used as an etch mask while the pillar layer is patterned. That is, the pillar layer may be etched using the photoresist pattern as an etch mask to form the array of the pillars 200, and the photoresist pattern may be removed after forming the array of the pillars 200. In such a case, the photoresist pattern acting as the etch mask may be formed using only a single photolithography step without a double patterning process requiring a plurality of photolithography steps.

Although the present embodiment is described in conjunction with an example in which the pillars 200 are formed by patterning the pillar layer using a photolithography process and an etch process, the present disclosure is not limited thereto. For example, in some embodiments, the pillars 200 may be formed by forming a template having a plurality of holes on the underlying layer 130, by forming the pillars 200 respectively filling the plurality of holes, and by removing the template.

Figure 3:
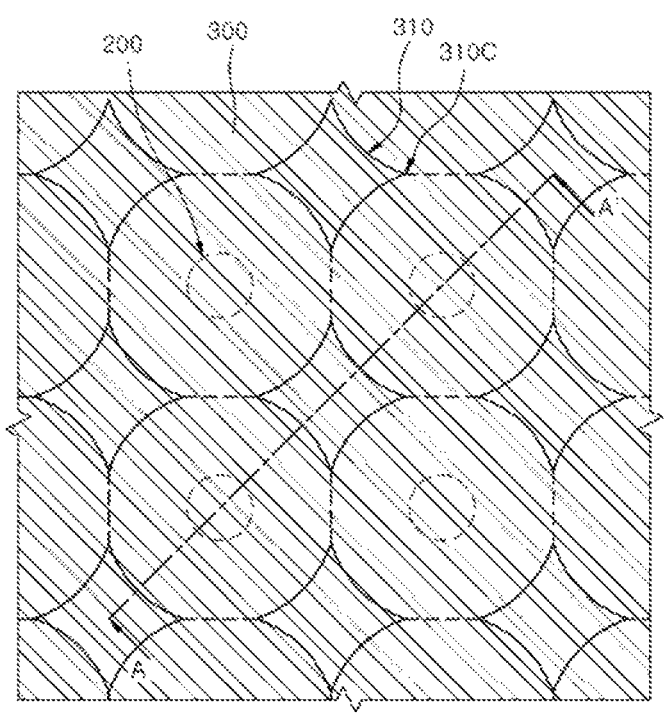
Figure 4:
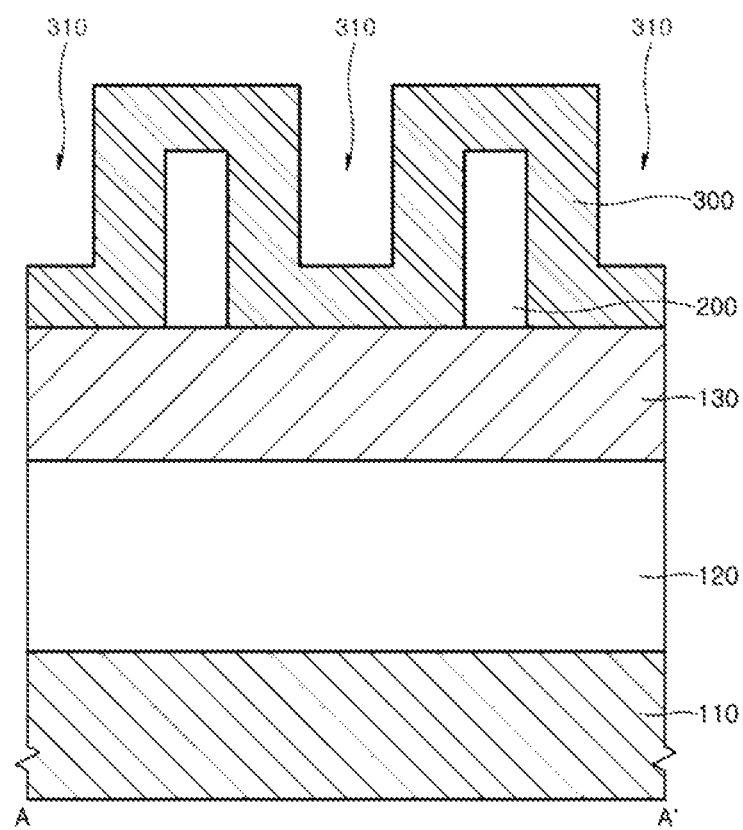

FIGS. 3 and 4 illustrate a step of forming a spacer layer 300. FIG. 4 is a cross-sectional view taken along a line A-A' of a plan view of FIG. 3.

As illustrated in FIGS. 3 and 4, the spacer layer 300 may cover the sidewalls of the pillars 200. The spacer layer 300 may include a third material, which is different from the pillars 200. For example, the spacer layer 300 may include a silicon oxide material, a polysilicon material and/or a silicon nitride material. The spacer layer 300 may be formed by depositing a dielectric material having an etch selectivity with respect to the pillars 200 and the underlying layer 130. For example, the spacer layer 300 may be formed by depositing an ultra-low temperature oxide (ULTO) material.

The spacer layer 300 may also cover the top surfaces of the pillars 200. In addition, the spacer layer 300 may extend onto a top surface of the underlying layer 130. The spacer layer 300 may be deposited on the sidewalk of the pillars 200 so that portions of the spacer layer 300 surrounding the sidewalls of the pillars 200 contact each other at regions between the adjacent pillars 200 arrayed in each row and at regions between the adjacent pillars 200 arrayed in each column. Thus, the spacer layer 300 may have a grid shape when viewed from a plan view.

When the spacer layer 300 is formed to have a grid shape in a plan view, first interstitial spaces 310 corresponding to first openings may be provided at regions between the adjacent pillars 200 arrayed in a diagonal direction. The spacer layer 300 may act as a guide layer providing the first interstitial spaces 310 located between the pillars 200. The first interstitial spaces 310 may correspond to spaces, which are surrounded by the spacer layer 300. Each of the first interstitial spaces 310 may be located at a central portion of a region which is surrounded by the four adjacent pillars 200. The spacer layer 300 may have a grid shape that provides the first interstitial spaces 310, upper portions of which are opened.

If each of the first interstitial spaces 310 is located at a central portion of a region which is surrounded by the four adjacent pillars 200, distances from the first interstitial space 310 to the four adjacent pillars 200 surrounding the first interstitial space 310 may be substantially equal to each other. Since the first interstitial spaces 310 are defined and provided by the spacer layer 300, which is deposited on the pillars 200, each of the first interstitial spaces 310 may have a planar shape, which is different from a circular shape of the pillars 200 in a plan view. For example, each of the first interstitial spaces 310 may have a tetragonal shape including four vertices, each of which is defined by a horn-shaped cleavage 310C, as illustrated in a plan view of FIG. 3. Each of the cleavages 310C of the first interstitial, spaces 310 may have a crack-shaped feature at a position where the portions of the spacer layer 300 are grown in a horizontal direction on sidewalls of the two adjacent pillars 200 to contact each other. Accordingly, each of the first interstitial spaces 310 may be defined and provided by four portions of the spacer layer 300 that are deposited on the four adjacent pillars 200 to contact each other. The cleavages 310C of the first interstitial spaces 310 may vertically extend at the position where the portions of the spacer layer 300 are grown on sidewalls of the two adjacent pillars 200 to contact each other. Each of the first interstitial spaces 310 may be surrounded by four portions of the spacer layer 300 that are deposited on sidewalls of the four adjacent pillars 200. Since a planar shape of each first interstitial space 310 is different from a planar shape of each pillar 200, it may be required to compensate or modify the planar shape of the first interstitial spaces 310 so that each of the first interstitial spaces 310 has a planar shape which is similar to a circular planar shape of the pillars 200.

Figure 5:
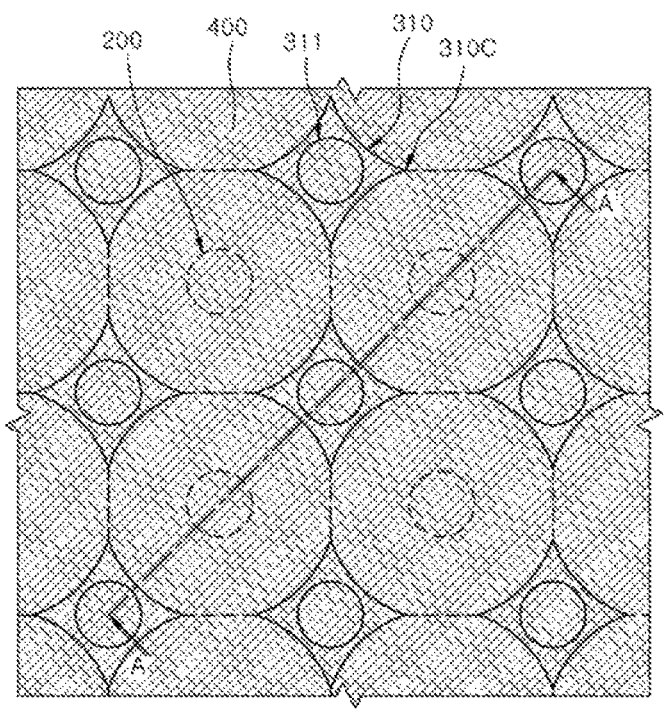
Figure 6:
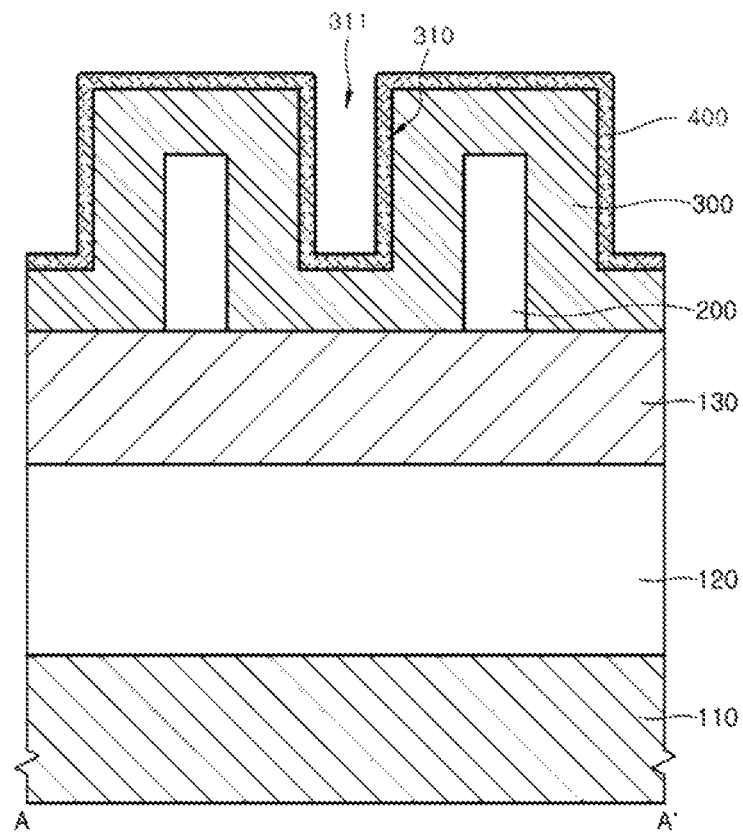

FIGS. 5 and 6 illustrate a forming of a healing layer 400, and FIG. 6 is a cross-sectional view taken along a line A-A of a plan view of FIG. 5.

As illustrated in FIGS. 5 and 6, the healing layer 400 may be formed on the spacer layer 300 to fill the cleavages 310C and to provide second interstitial spaces 311 corresponding to second openings in the first interstitial spaces 310. The healing layer 400 may be firstly formed to fill the cleavages 310C. Thus, each of the second interstitial spaces 311 may have a rounded shape. That is, the healing layer 400 may provide the second interstitial spaces 311 having a circular planar shape.

Figure 17:
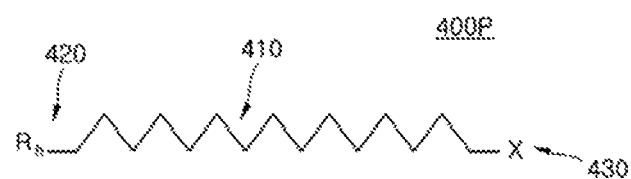
FIG. 17 is a schematic diagram of a polymer chain constituting a healing layer used in a method for forming fine patterns, according to an embodiment of the present disclosure.
Figure 18:
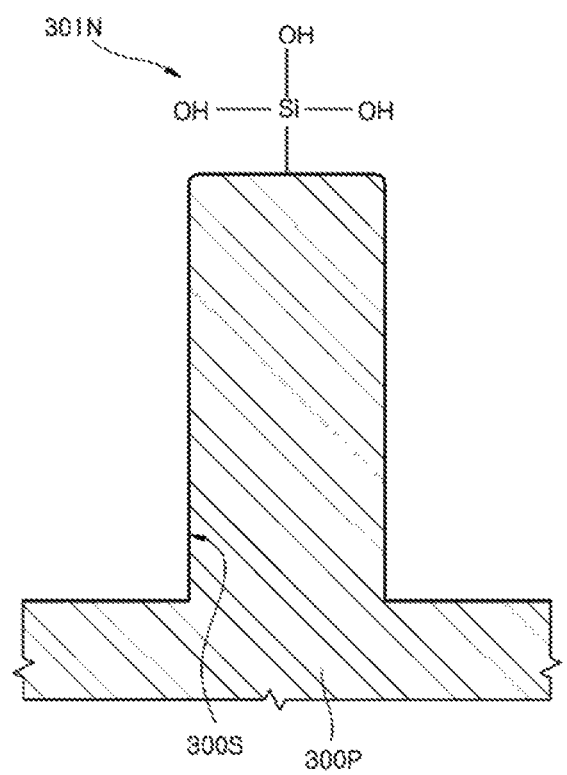
FIG. 18 illustrates a surface functional group of a spacer layer used in a method for forming fine patterns, according to an embodiment of the present disclosure.
Figure 19:
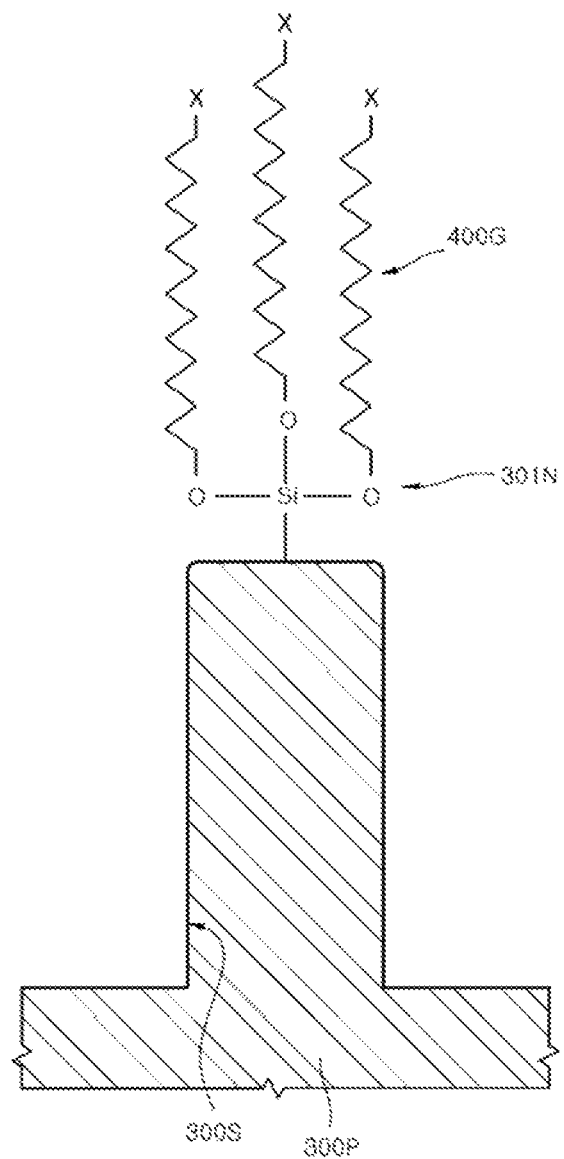
FIG. 19 is a schematic diagram illustrating polymer chains grafted onto a pattern structure used in a method for forming fine patterns according to an embodiment of the present disclosure.

The healing layer 400 may include a polymer chain 400P illustrated in FIG. 17, and the healing layer 400 including the polymer chain 400P may be formed on the spacer layer 300 using a spin coating process. FIG. 17 is a schematic diagram of the polymer chain 400P constituting the healing layer 400 used in a method of forming fine patterns according to an embodiment. The polymer chain 400P may include a chain body 410 comprised of a carbon chain, a head functional group (Rh) 420 combined with one end of the chain body 410, and a terminal group (X) 430 combined with the other end of the chain body 410. The head functional group (Rh) 420 may include hydroxyl (OH—) groups that are capable of reacting with surface functional groups 301N existing on a surface 300S of a pattern structure 300P including the spacer layer (300 of FIG. 5) as illustrated in FIG. 18. For example, the head functional group (Rh) 420 may include hydroxyl (OH—) groups, which are capable of reacting with hydrogen (H+) groups bonded to dangling bonds (or broken bonds) of a surface of a silicon oxide layer. As illustrated in FIG. 19, the head functional groups (Rh) 420 of the polymer chains 400P may react with the surface functional groups 301N of the surface 300S of the pattern structure 300P to cause a grafting reaction that combines the polymer chains 400P with the surface 300S of the pattern structure 300P. FIG. 19 illustrates the grafting reaction of the polymer chains 400P. For example, the hydrogen (H+) groups adsorbed on the surface 300S of the pattern structure 300P comprised of a silicon oxide material may react with the hydroxyl (OH—) groups corresponding to the head functional groups (Rh) 420 to provide covalent bonds that combines the polymer chains 400P with the silicon oxide material. As a result of the grafting reaction of the polymer chains 400P, water (H$_2$O) may be produced as byproduct.

Figure 20:
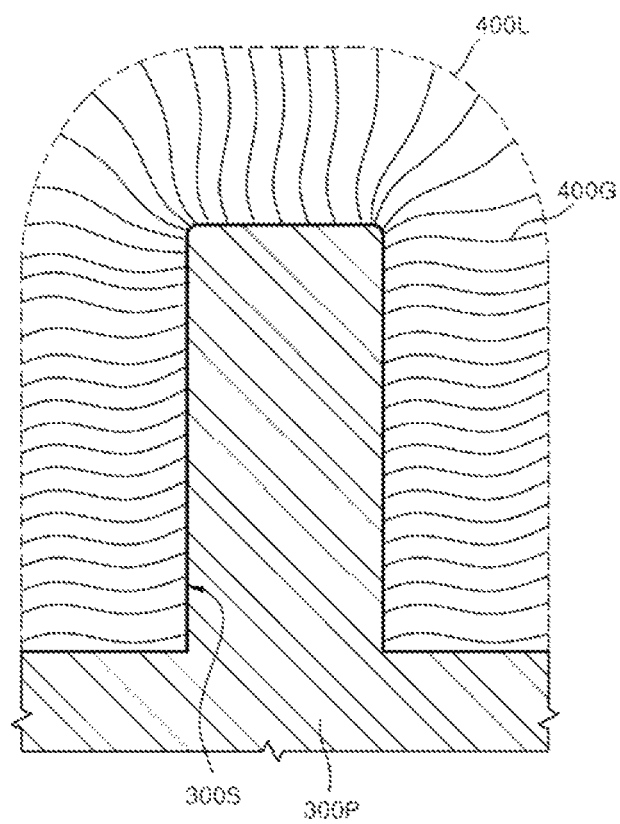
FIG. 20 illustrates a step of forming a grafting layer used in a method for forming fine patterns, according to an embodiment of the present disclosure.

The head functional groups (Rh) 420 of the polymer chains 400P, which are capable of being grafted onto the silicon oxide material by covalent bonds, may include silane groups, ortho groups, amine groups, alkyne groups, alkane groups, catechol groups, carboxylate groups, phosphonate groups, or the like. The terminal groups (X) 430 may be inactive groups that do not participate in the grafting reaction of the polymer chains 400P. Since only the head functional groups (Rh) 420 participate in the grafting reaction of the polymer chains 400P, grafted polymer chains 400G may be aligned to be substantially parallel with each other and to be substantially perpendicular to the surface 300S of the pattern structure 300P, as illustrated in FIG. 20. FIG. 20 illustrates a step of forming a grafting layer 400L. The grafting layer 400L may constitute a portion of the healing layer (400 of FIG. 5). The grafted polymer chains 400G may be combined with the spacer layer (300 of FIG. 5) or the pattern structure 300P to be substantially perpendicular to the surface of the spacer layer 300 or the surface 300S of the pattern structure 300P.

The polymer chains (400P of FIG. 17) may be dispersed in a solvent to provide a solution, and the solution may be coated on the spacer layer (300 of FIG. 6). The solvent may be an organic solvent. A surface treatment process may be applied to a surface of the spacer layer 300 before the solution containing the polymer chains 400P is coated on the spacer layer 300. The surface treatment process may be performed using a thermal annealing process to remove moisture on the surface of the spacer layer 300. A surface roughness of the spacer layer 300 may also be improved by the thermal annealing process. For example, the thermal annealing process may be performed using a low oxygen gas as an ambient gas. In some embodiments, the thermal annealing process may be performed in vacuum or using an inert gas as an ambient gas. The thermal annealing process may be performed at a temperature of approximately 100 degrees Celsius to approximately 400 degrees Celsius. In an embodiment, the surface treatment process may be performed using a plasma process. For example, oxygen plasma may be supplied to the surface of the spacer layer 300 to improve an efficiency of the grafting reaction of the polymer chains 400P.

After the solution containing the polymer chains 400P is coated on the spacer layer 300, a baking process may be applied to the solution containing the polymer chains 400P. The baking process may be performed to graft the polymer chains 400P onto the surface 300S of the pattern structure 300P or onto the surface of the spacer layer 300. As a result of the baking process, the grafting layer 400L containing the polymer chains 400P may be formed on the pattern structure 300P or the spacer layer 300. The baking process may be performed at a temperature of approximately 140 degrees Celsius to approximately 250 degrees Celsius to induce covalent bonds for the grafting reaction.

When the polymer chains 400P are grafted onto the surface 300S of the pattern structure 300P to form the grafting layer 400L during the baking process some of the polymer chains 400P may not react with the surface 300S of the pattern structure 300P to act as non-grafted polymer chains 400U that float in the grafting layer 400L. The non-grafted polymer chains 400U may be categorized into two groups that roughly behave in two different ways. Behavior of the non-grafted polymer chains 400U may be distinct according to positions of the non-grafted polymer chains 400U.

Figure 21:
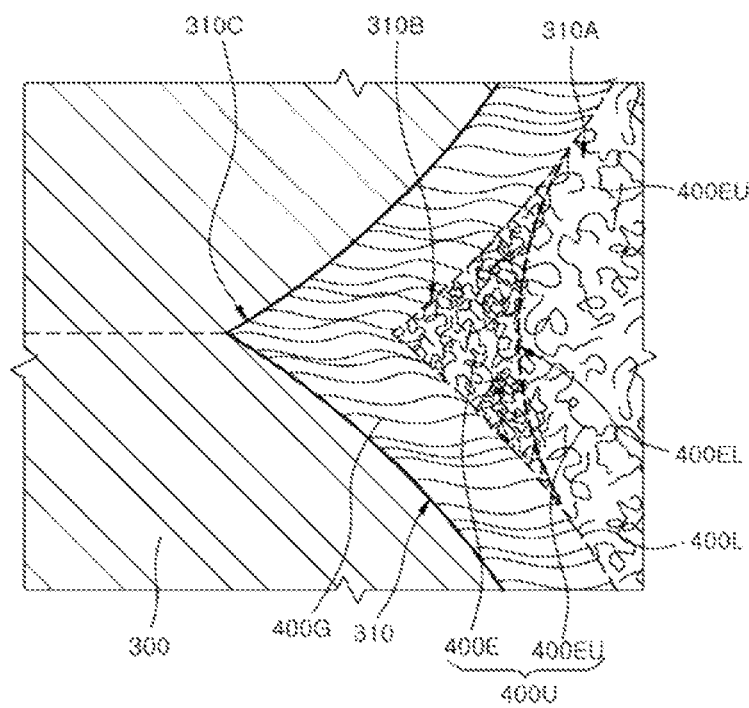
FIG. 21 illustrates a step for forming a healing layer used in a method for forming fine patterns, according to an embodiment of the present disclosure.

FIG. 21 is an enlarged view illustrating a portion of the healing layer 400 shown in FIG. 5. Referring to FIGS. 5 and 21, if the grafting layer 400L is formed on the spacer layer 300, first portions 310B of the first interstitial spaces 310 adjacent to the cleavages 310C may be relatively narrow as compared with second portions 310A of the first interstitial spaces 310, which are located far from the cleavages 310C. That is, the second portions 310A of the first interstitial spaces 310 may be relatively wide as compared with the first portions 310B of the first interstitial spaces 310 adjacent to the cleavages 310C.

Figure 22:
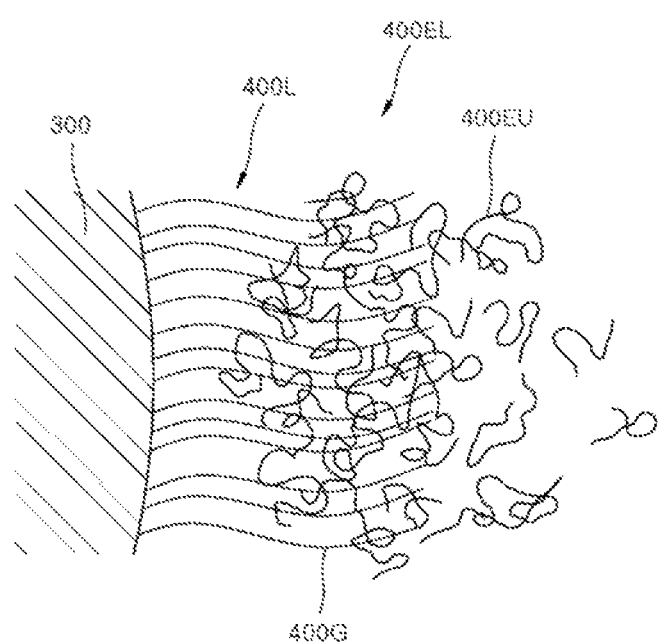
FIG. 22 illustrates an entanglement movement of polymer chains used in a method for forming fine patterns, according to an embodiment of the present disclosure.

In the first portions 310B of the first interstitial spaces 310 having a relatively narrow width, the non-grafted polymer chains 400U may be entangled with the grafted polymer chains 400G by an entanglement movement to produce entangled polymer chains 400E, as illustrated in FIG. 21. FIG. 22 illustrates the entanglement movement of the polymer chains 400P. As illustrated in FIGS. 21 and 22, the entangled polymer chains 400E may have an intermixed state that is entangled with the grafted polymer chains 400G and may anchor in the first portions 310B of the first interstitial spaces 310. The entangled polymer chains 400E may constitute an entanglement layer 400EL, and the entanglement layer 400EL may substantially fill the cleavages 310C of the first interstitial spaces 310.

In the second portions 310A of the first interstitial spaces 310 having a relatively wide width, the non-grafted polymer chains 400U may move freely to act as non-entangled/non-grafted polymer chains 400EU. The non-entangled/non-grafted polymer chains 400EU may have a density which is lower than a density of the entangled polymer chains 400E. That is, the entangled polymer chains 400E anchored in the first portions 310B of the first interstitial spaces 310 may have a density which is higher than a density of the non-entangled/non-grafted polymer chains 400EU. The density difference between the entangled polymer chains 400E and the non-entangled/non-grafted polymer chains 400EU may induce a difference between a solubility of the entangled polymer chains 400E and a solubility of the non-entangled/non-grafted polymer chains 400EU. The entangled polymer chains 400E are entangled with the grafted polymer chains 400G to have a relatively high density. The non-entangled/non-grafted polymer chains 400EU are not entangled with each other and may exhibit a relatively high solubility in a certain solvent as compared with the entangled polymer chains 400E.

Figure 23:
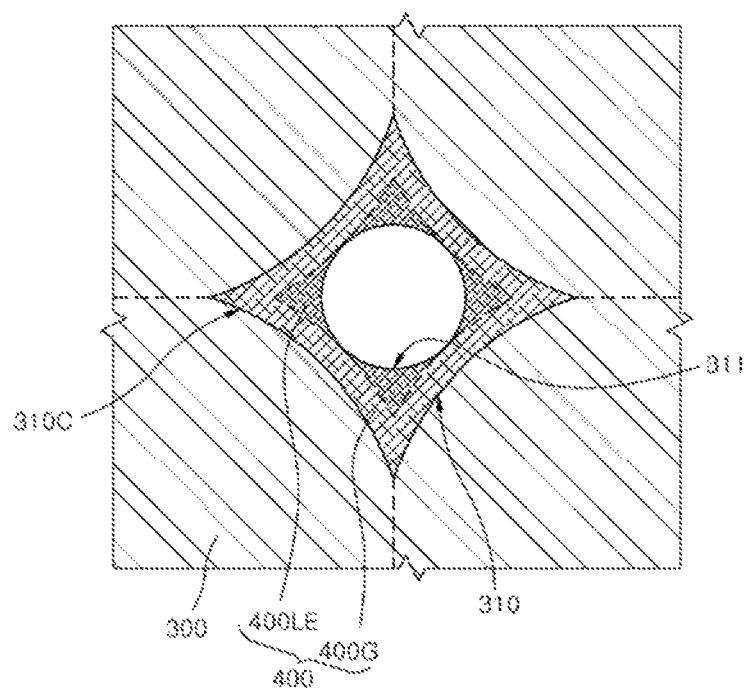
FIG. 23 illustrates a step of removing polymer chains which are not entangled in a method for forming fine patterns, according to an embodiment of the present disclosure.

As illustrated in FIGS. 21 and 22, the grafted polymer chains 400G may form the grafting layer 400L and the entangled polymer chains 400E may form the entanglement layer 400EL. After the grafting layer 400L and the entanglement layer 400EL are formed, the non-entangled/non-grafted polymer chains 400EU may be selectively removed by exploiting the solubility difference between the non-entangled/non-grafted polymer chains 400EU and the entangled polymer chains 400E, as illustrated in FIG. 23. Since the non-entangled/non-grafted polymer chains 400EU may exhibit a relatively high solubility in an organic solvent as compared with the entangled polymer chains 400E, the non-entangled/non-grafted polymer chains 400EU may be selectively removed using an organic solvent to form the healing layer 400 that provides the second interstitial spaces 311 corresponding to second openings in the first interstitial spaces 310. In an embodiment, the non-entangled/non grafted polymer chains 400EU may be selectively removed using an organic solvent, such as, N-butyl acetate (nBA), propylene glycol methyl ether acetate (PGMEA), methyl methoxy propionate (MMP) thinner, or a mixture of PGMEA and propylene glycol monomethyl ether (PGME).

As illustrated in FIGS. 5 and 23, since the healing layer 400 may fill the cleavages 310C of the first interstitial spaces 310, each of the second interstitial spaces 311 may be provided to have substantially the same planar shape as each pillar 200. That is, the second interstitial spaces 311 may be provided to have a circular shape in a plan view due to the healing layer 400 that is formed to fill the cleavages 310C of the first interstitial spaces 310.

The healing layer 400 may modify a sidewall profile of the spacer layer 300. The healing layer 400 may fill the cleavages 310C of the first interstitial spaces 310 to smooth the sidewall profile of the spacer layer 300 or to alleviate the surface roughness of the spacer layer 300. That is, even though the spacer layer 300 has a rough sidewall, the healing layer 400 may alleviate the roughness of the sidewall of the spacer layer 300.

Figure 7:
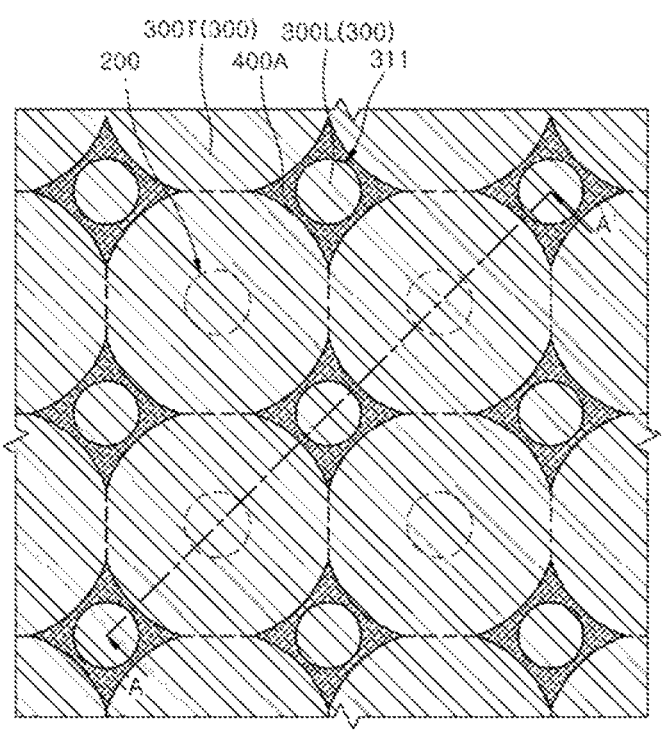
Figure 8:
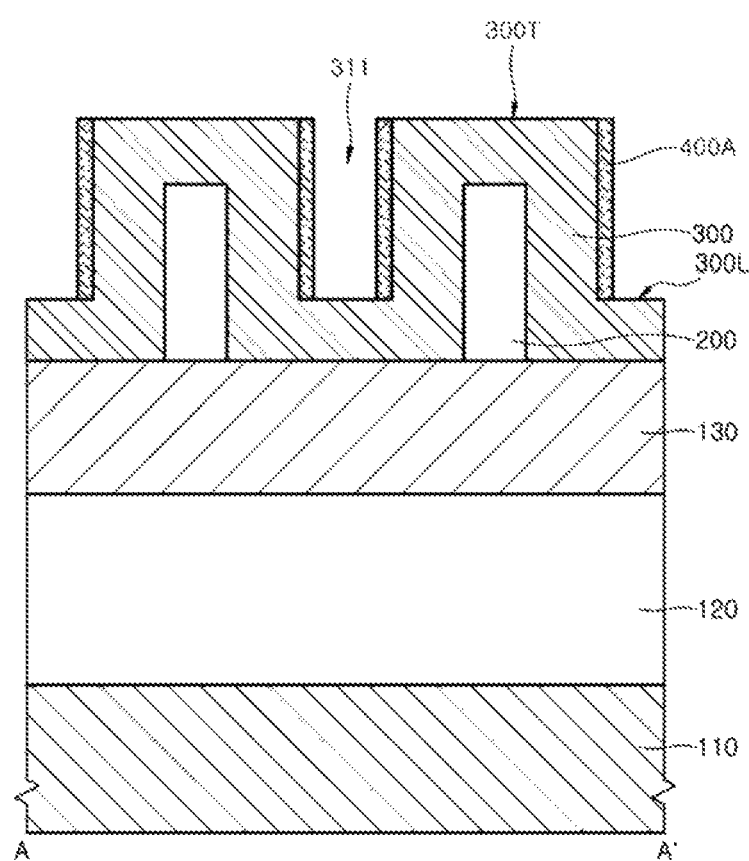
Figure 9:
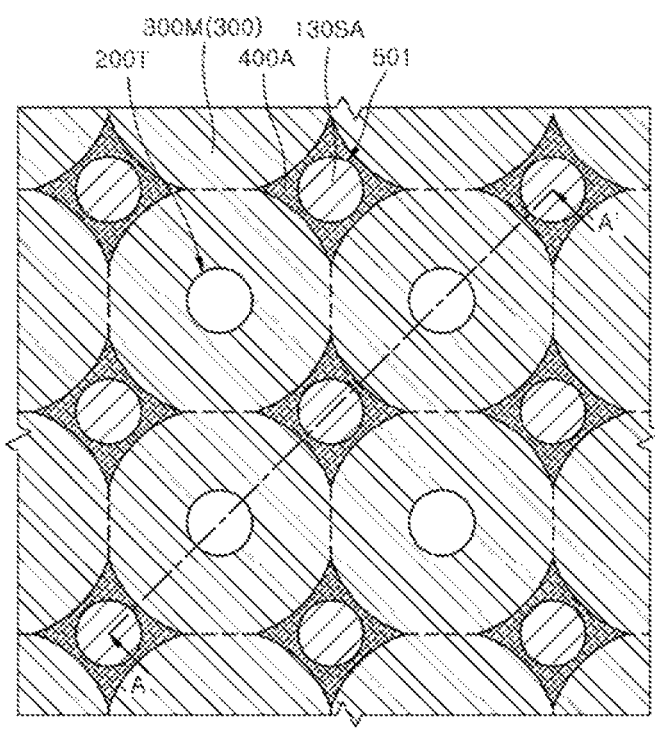
Figure 10:
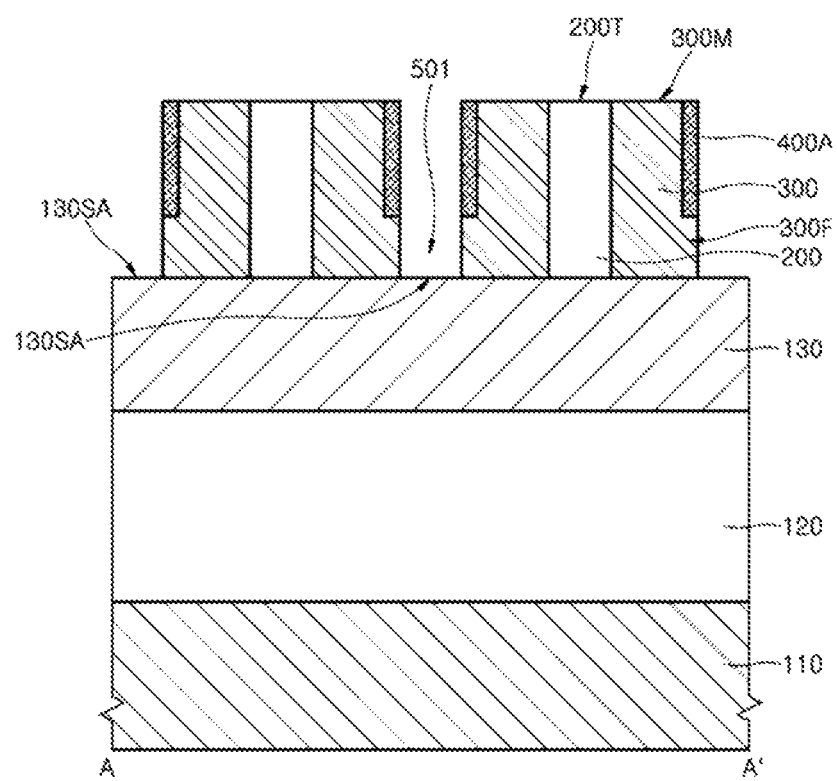

FIGS. 7 to 10 illustrate a forming of third interstitial spaces 501 in the spacer layer 300 using the healing layer 400. FIG. 8 is a cross-sectional view taken along a line A-A' of a plan view shown FIG. 7, and FIG. 10 is a cross-sectional view taken along a line A-A' of a plan view shown FIG. 9.

As illustrated in FIGS. 7 and 8 the healing layer 400 may be anisotropically etched to form healing patterns 400A that are located on sidewalls of the spacer layer 300. After the healing patterns 400A are formed, first portions 300T of the spacer layer 300 covering the top surfaces of the pillars 200 may be exposed and second portions 300L of the spacer layer 300 covering a top surface of the underlying layer 130 may also be exposed. Since the healing patterns 400A are formed to cover the sidewalls of the spacer layer 300, the healing patterns 400A may correspond to additional spacers formed on the spacer layer 300.

As illustrated in FIGS. 9 and 10, the first portions 300T and the second portions 300L of the spacer layer 300 may be anisotropically etched using the healing patterns 400A as etch masks to expose top surfaces 200T of the pillars 200 and portions of a top surface 130SA of the underlying layer 130. In such a case, top surfaces 300M of the remaining portions of the spacer layer 300 may be substantially coplanar with the top surfaces 200T of the pillars 200. While the first portions 300T and the second portions 300L of the spacer layer 300 are anisotropically etched, the second interstitial spaces 311 may vertically and downwardly extend into the spacer layer 300 to provide the third interstitial spaces 501 corresponding to third openings exposing portions of the underlying layer 130. That is, the third interstitial spaces 501 may be surrounded by portions 300F of the spacer layer 300 under the healing patterns 400A.

Figure 11:
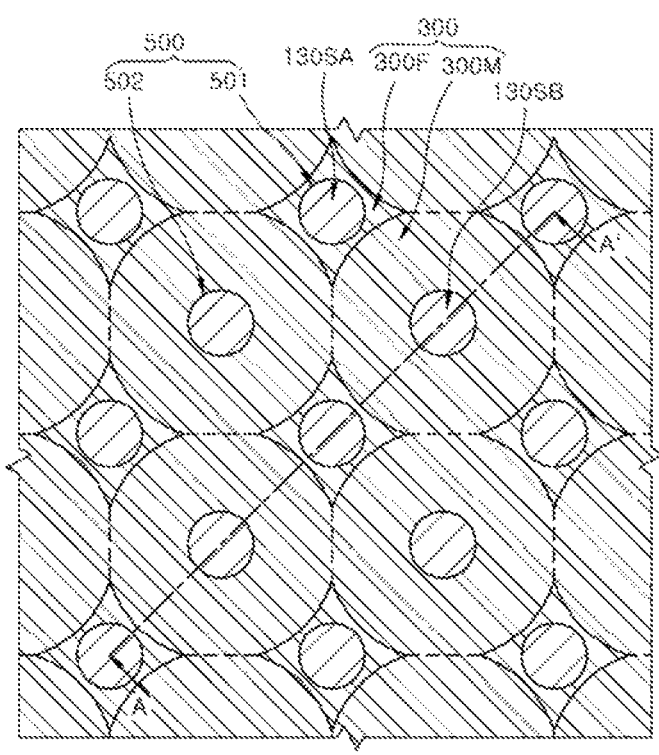
Figure 12:
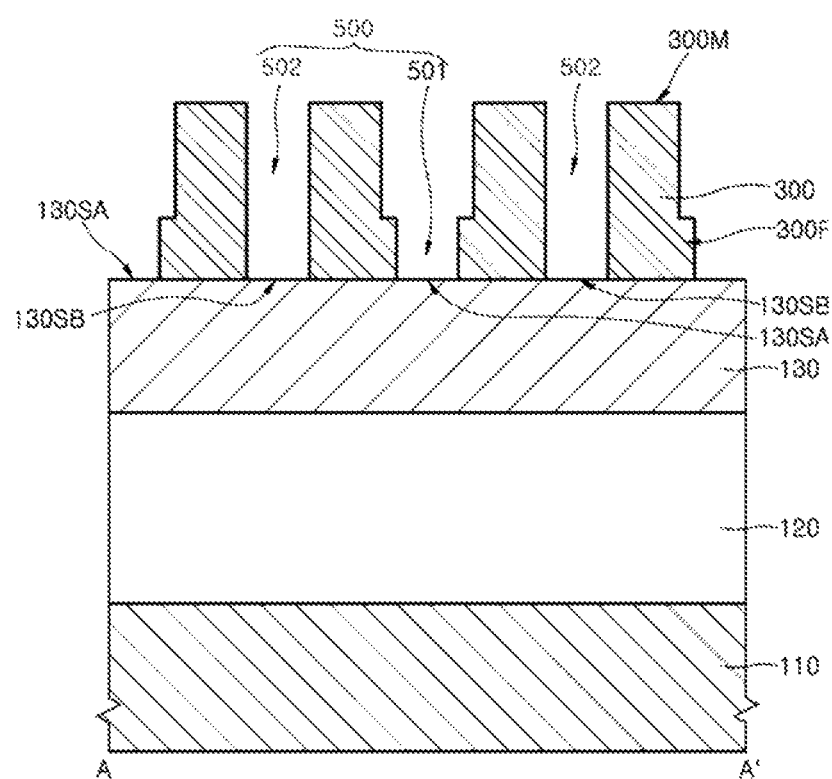

FIGS. 11 and 12 illustrate a step of removing the pillars 200. FIG. 12 is a cross-sectional view taken along a line A-A' of a plan view shown in FIG. 11.

As illustrated in FIGS. 11 and 12, the pillars 200 exposed by the anisotropically etched spacer layer 300 may be selectively removed to provide fourth interstitial spaces 502 corresponding to fourth openings. The fourth interstitial spaces 502 may expose portions 130SB of the underlying layer 130. The anisotropically etched spacer layer 300 may have a grid shape providing openings 500 corresponding to fourth openings such as holes. The openings 500 may include the third and fourth interstitial spaces 501 and 502.

Figure 13:
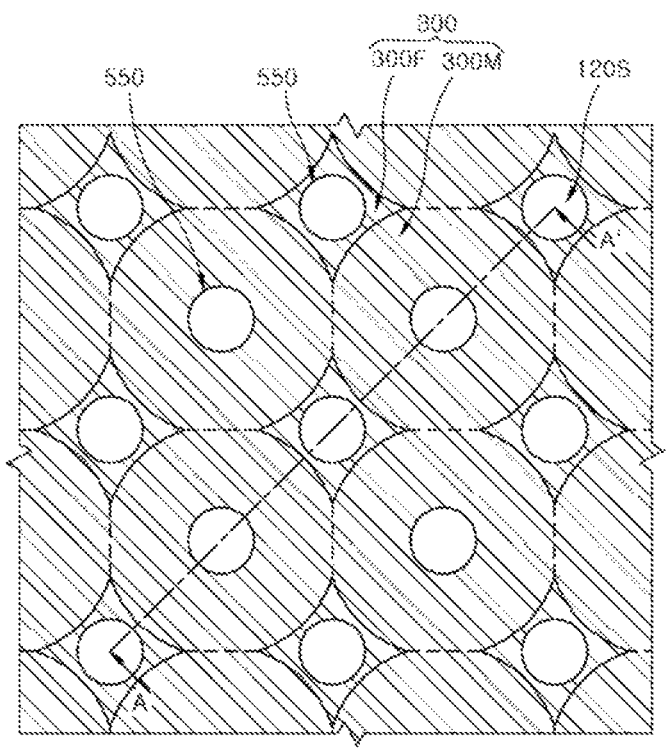
Figure 14:
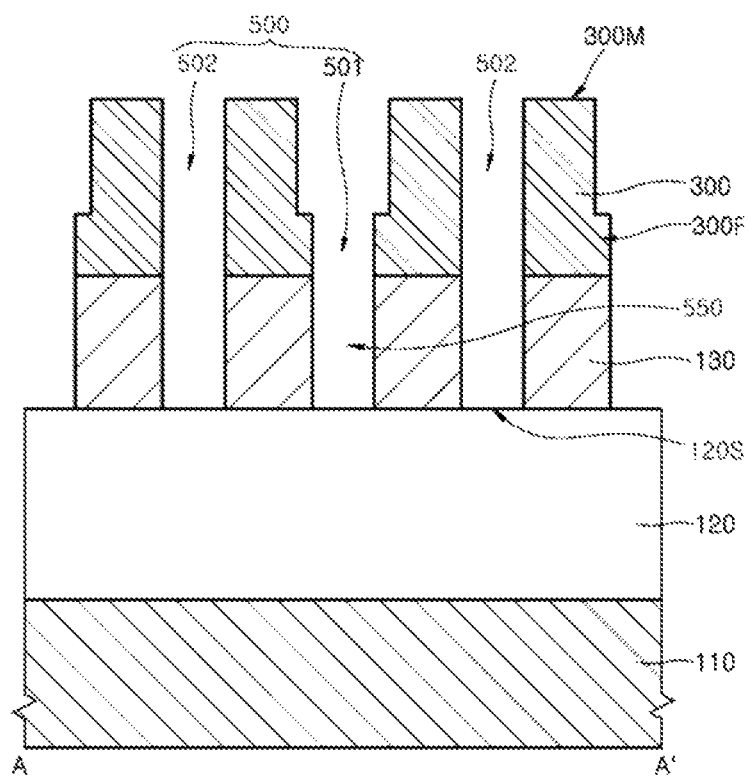

FIGS. 13 and 14 illustrate forming of first through holes 550. FIG. 14 is a cross-sectional view taken along a line A-A' of a plan view shown in FIG. 13.

As illustrated in FIGS. 3 and 14, the portions 130S and 130SB of the underlying layer 130 exposed by the openings 500 may be selectively etched using the anisotropically etched spacer layer 300 as an etch mask. As a result, first through holes 550 penetrating the underlying layer 130 may expose portions 1205 of the patterning target layer 120. The first through holes 550 may have substantially the same planar shapes as the third or fourth interstitial spaces 501 or 502. That is, the openings 500 may vertically and downwardly extend into the underlying layer 130 to form the first through holes 550. Accordingly, the portions 1205 of the patterning target layer 120 may be exposed by the first through holes 550, respectively. After the first through holes 550 are formed, the anisotropically etched spacer layer 300 may be selectively removed.

Figure 15:
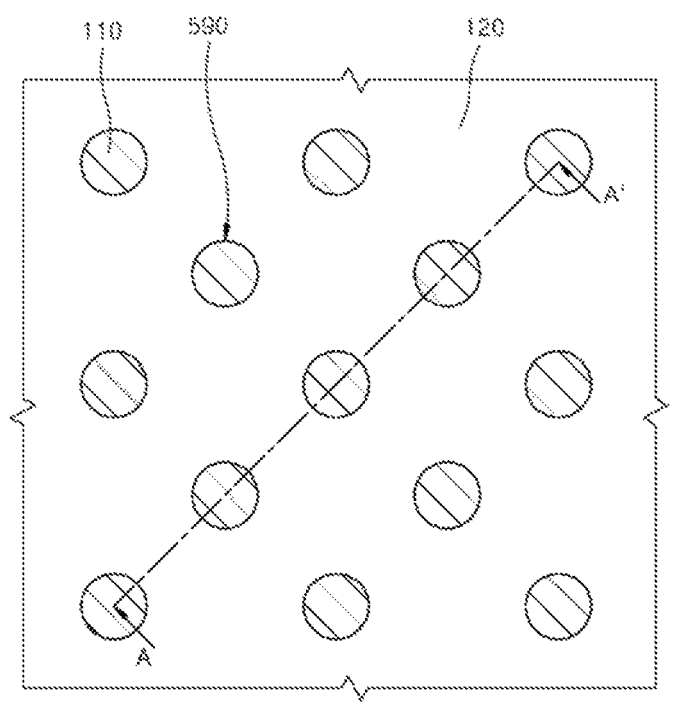
Figure 16:
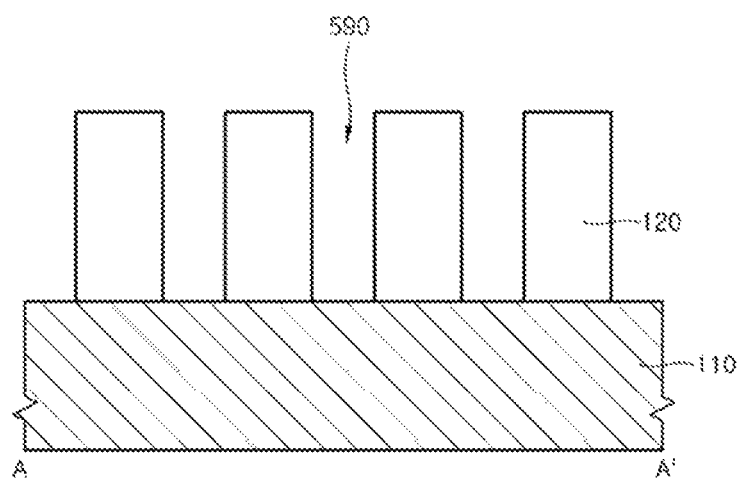

FIGS. 15 and 16 illustrate forming of second through holes 590. FIG. 16 is a cross-sectional view taken along a line A-A' of a plan view shown in FIG. 15.

As illustrated in FIGS. 15 and 16, the portions 1205 of the patterning target layer 120 may be etched using the underlying layer 130 having the first through holes 550 as an etch mask until the substrate 110 is exposed. As a result, the second through holes 590 penetrating the patterning target layer 120 may be formed. Accordingly, the first through holes 550 may vertically and downwardly extend into the patterning target layer 120 to provide the second through holes 590. After the second through holes 590 are formed, the underlying layer 130 having the first through holes 550 may be removed.

An array of the second through holes 590 may be used as contact holes for forming interconnection structures of memory devices for example DRAM devices or logic devices. Alternatively, the array of the second through holes 590 may be used in the formation of pillar electrodes or cylindrical electrodes of capacitor structures in the DRAM devices. In some other embodiments, the array of the second through holes 590 may be used in the formation of memory devices having a cross point cell array structure.

According to the embodiments described above, nanoscale structures or nano structures can be fabricated on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nanoscaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products, such as, mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art appreciate that various modifications, additions and substitutions are possible, without departing from the scope and spirit of the present disclosure and the accompanying claims.

What is claimed is:

1. A method for forming fine patterns, the method comprising:

forming pillars arrayed in rows and columns over an underlying layer;

forming a spacer layer over the underlying layer to cover the pillars, wherein portions of the spacer layer respectively covering the pillars arrayed in each row or in each column contact each other to provide first interstitial spaces disposed between the pillars, wherein the first interstitial spaces are arrayed in a diagonal direction between a row direction and a column direction and wherein the first interstitial spaces have cleavages at corners of each of the first interstitial spaces; and forming a healing layer on the spacer layer to fill the cleavages of the first interstitial spaces, wherein the healing layer is formed to provide second interstitial spaces respectively located in the first interstitial spaces and to include a polymer material, and wherein forming the healing layer include:

coating a solution including polymer chains over the spacer layer;

baking the solution to graft some of the polymer chains onto a surface of the spacer layer and to induce an entanglement movement so that some of the graft polymer chains are entangled with some of non-graft polymer chains to fill the cleavages; and removing non-entangled polymer chains among the non-graft polymer chains.

2. The method of claim 1, wherein the first interstitial spaces are surrounded by the spacer layer covering sidewalls of the pillars.

3. The method of claim 1, wherein the healing layer is formed to provide the second interstitial spaces having substantially the same planar shape as the pillars.

4. The method of claim 1, wherein each of the polymer chains includes a chain body and a functional group combined with one end of the chain body; and wherein the functional group reacts with the spacer layer.

5. The method of claim 4, wherein baking the solution is performed to induce a covalent bond by which the functional group is combined with a surface functional group of the spacer layer.

6. The method of claim 1, further comprising applying an annealing process to a surface of the spacer layer before the healing layer is formed.

7. The method of claim 1, further comprising extending the second interstitial spaces to penetrate the underlying layer.

8. The method of claim 7, further comprising selectively removing the pillars to form third interstitial spaces before extending the second interstitial spaces.

* * * * *